Oct. 17, 1967 TAKASHI NAGATA ETAL 3,348,078

PIEZOELECTRIC CERAMIC RESONATOR DEVICES

Filed May 26, 1965 2 Sheets-Sheet 1

INVENTORS
Takashi Nagata
Hyogo Hirohata
Michio Ishibashi
Shizuo Arimura
BY
Stevens, Davis, Miller & Mosher
ATTORNEYS

PIEZOELECTRIC CERAMIC RESONATOR DEVICES

Filed May 26, 1965 2 Sheets-Sheet 2

INVENTORS
Takashi Nagata
Hyogo Hirohata
Michio Ishibashi
Shizuo Arimura

BY
Stevens, Davis, Miller & Mosher
ATTORNEYS

United States Patent Office 3,348,078

Patented Oct. 17, 1967

3,348,078

PIEZOELECTRIC CERAMIC RESONATOR DEVICES

Takashi Nagata, Ikeda-shi, Hyogo Hirohata, Neyagawa-shi, Michio Ishibashi, Kadoma-shi, and Shizuo Arimura, Neyagawa-shi, Japan, assignors to Matsushita Electric Industrial Co., Ltd., Osaka, Japan, a corporation of Japan Filed May 26, 1965, Ser. No. 459,064

Claims priority, application Japan, May 30, 1964, 39/30,807; June 4, 1964, 39/31,977; July 14, 1964, 39/40,225; Oct. 27, 1964 (utility model), 39/84,520; Oct. 28, 1964, 39/61,924

6 Claims. (Cl. 310—9.5)

This invention relates to electromechanical transducers and more particularly to piezoelectric ceramic resonator devices for use as a resonant circuit component in a high frequency electrical circuit. The invention will be described with regard to its application to a sound trap circuit in a television receiver. This application is one of the most important uses of the invention at present time.

The term "piezoelectric ceramics" is used herein to designate sintered ferroelectric ceramic materials which are electrostatistically polarizable.

Many piezoelectric ceramic materials having excellent peizoelectric properties have been heretofore known in the previous arts. The lead titanate-zirconate ceramic material disclosed in U.S. Patent No. 2,708,244 has a high electromechanical coupling coefficient, a high mechanical quality factor Q of vibration, a low temperature coefficient of a resonant frequency and a high durability. The piezoelectric resonator elements have been used in electrical wave filters and resonant circuit components. The wide passbands of the electrical wave filters and the low resonant impedances of the resonant circuit could not be obtained with piezoelectric crystals such as quartz crystal.

In a high frequency region above 1 mc., a piezoelectric ceramic resonator element using the thickness-expansion vibration mode or the thickness-shear vibration mode is effective in the same way as that a quartz crystal resonator is. However, difficulty has been encountered in the utilization of these thickness vibration modes, because subresonant vibrations are liable to piezoelectrically couple with the thickness vibration depending on boundary conditions of the finite contour shape. Especially subresonant vibrations have been unavoidable in piezoelectric ceramic resonator elements having high electromechanical coupling coefficient than that of the quartz crystal. The subresonant vibrations being excited near the thickness vibration can close to be piezoelectrically suppressed by making the piezoelectric ceramic resonator element to have a partial electrode structure. This partial electrode structure, however, has also been faulty because of its unavoidable increase in the resonant impedance of the thickness vibration per se.

Detailed theoretical analyses of an isotropic, elastic circular disk have been given by R. D. Mindlin (Journal of Applied Physics, vol. 25, 1954, pp. 1329–1332). R. Stark has also calculated a circular disk of a AT-cut quartz crystal with regard to thickness-shear vibration (Telefunken Zeitung, Jg. 31, Heft 21, September 1958, pp. 179–187). From these theoretical analyses, a piezoelectric ceramic resonator element of the thickness-shear vibration mode clearly excites flexural vibrations, thickness-twist vibrations and coupling vibrations of these vibrations. Generally, these flexural vibrations, thickness-twist vibration and coupling vibration results in unwanted responses on a piezoelectric ceramic disk resonator element of the thickness-shear vibration mode. The application of resonator element in an electric circuit decreases with an increase in the unwanted responses. On the other hand, in a high frequency region above 1 mc., wave lengths of the elastic vibration of piezoelectric ceramic resonator element will be less than several millimeters. The influence of pin holes present in the piezoelectric ceramic materials commercially available is strong in many cases and can not be neglected for the vibrations of such short wave lengths. Consequently, there exists many irregular unwanted vibrations in addition to the above-described ones.

A piezoelectric ceramic disk resonator element of the thickness-shear vibration must be provided with electrodes after polarization because the direction of polarization must be parallel to faces of driving electrodes. Therefore, electrode materials are extremely limited the electrodes must be formed without impairing the polarization. Electrodelessly plated nickel electrodes are especially suitable for a piezoelectric ceramic resonator element in an operation of elastic vibrations of short wave lengths. Since the optimum operating temperature of the electrodesless nickel plating is more than 100° C., the nickel electrode is difficult to be formed on the resonator element without adversely affecting the state of polarization.

Further in a piezoelectric ceramic resonator element of thickness-shear vibration mode, no nodal points of vibration is present on its electrodes at the resonant condition. Generally, the electrical terminal has been difficult to be formed without bad effects on the resonant frequency and resonant impedance of the resonator element. Consequently, a device for supporting the resonator element has become more complicated and its cost, higher than those of the resonator element per se.

The general object of the present invention is to provide a novel piezoelectric ceramic resonator device overcoming at least one of the problems of the prior art as outlined above.

Another object of the present invention is to provide piezoelectric ceramic resonator devices applicable for a high frequency electrical resonant circuit. Another object of the present invention is to provide piezoelectric ceramic resonator device having extremely low resonant impedance in a high frequency region.

Another object of the present invention is to provide piezoelectric ceramic resonator devices having extremely lower resonant impedance than that of quartz crystal resonator elements.

Still another object of the present invention is to provide piezoelectric ceramic resonator devices having lower resonant impedances than that of prior piezoelectric ceramic resonator elements utilizing the thickness-expansion vibration and the contour vibration.

A further object of the present invention is to provide improved piezoelectric ceramic resonator devices which are in smaller size, less expensive and in simpler structure than electromagnetic components or electromechanical components.

The above and other objects including advantages and features of the present invention will become apparent from the following detailed description with reference to the accompanying drawings.

The present invention will now be described in further detail with reference to the drawings.

Figure 1:
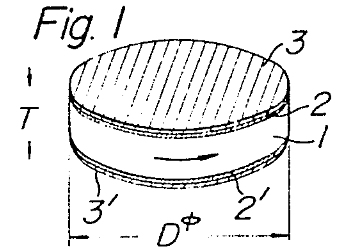
FIG. 1 is a general outline view of a piezoelectric ceramic resonator element employed in the piezoelectric ceramic resonator device of the present invention.

FIGURE 1 shows the structure of the piezoelectric ceramic disk resonator element of thickness-shear vibration mode including a substantially flat, thin circular disk 1 of a piezoelectric ceramic material. The dimension of the disk 1 has a thickness T and a diameter D.

The direction of polarization of the piezoelectric disk 1 is unidirectional as indicated by an arrow and perpendicular to the axis of the disk 1. Copper electrodes 2 and 2′ are provided on both of the parallel end faces of the piezoelectric ceramic disk 1 by an electrodeless copper plating method. Gold or silver electrodes 3 and 3′ are superposed on the respective copper electrodes 2 and 2′ by chemical displacing. The electrodes 2 and 3, and 2′ and 3′ are required to be sufficiently uniform and electrically conductive.

Figures 2, 8, 9, 10:
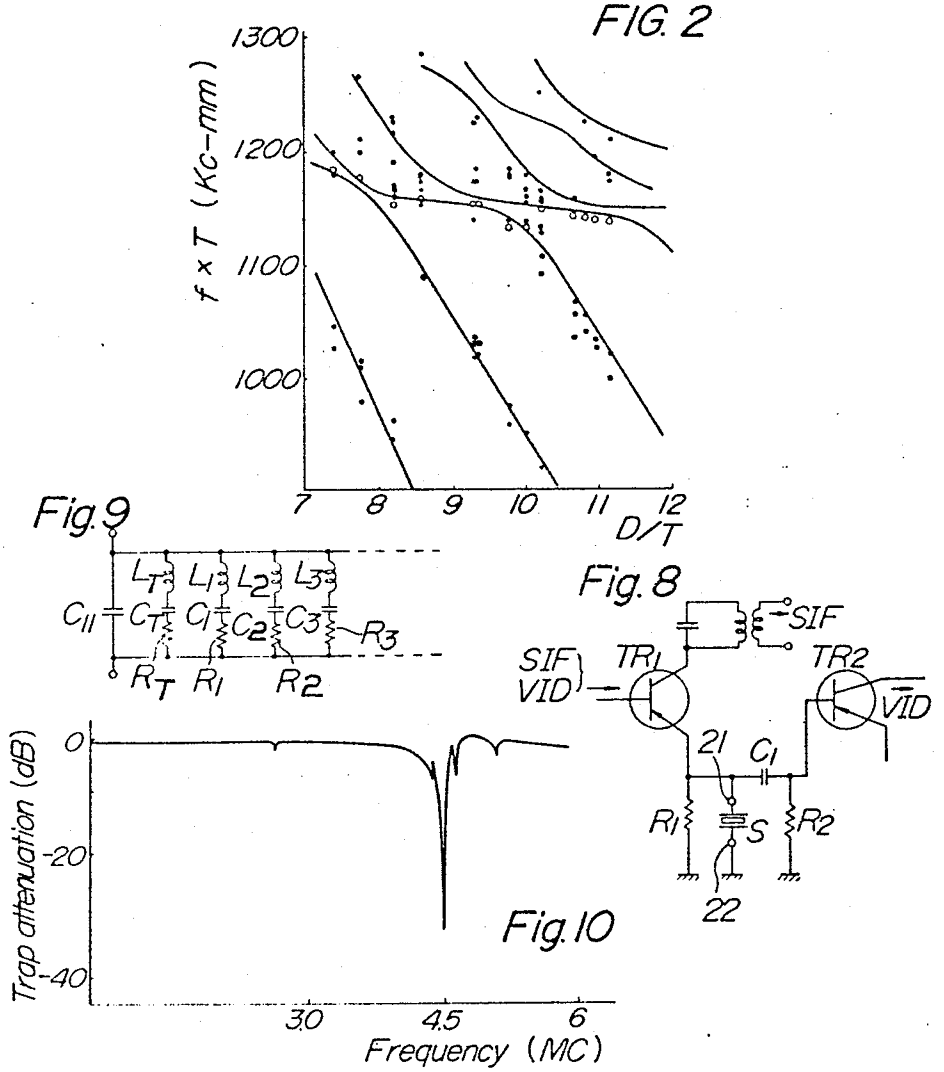
FIG. 2 is a graphic illustration of resonance spectra of the piezoelectric ceramic resonator element shown in FIG. 1.
FIG. 8 is a schematic diagram of an example of a transistor television circuit embodying the piezoelectric ceramic resonator device of the present invention.
FIG. 9 is a schematic diagram of an equivalent circuit of the piezoelectric ceramic resonator device of the present invention.
FIG. 10 is a graphic illustration of the output characteristics of the inventive device with respect to a video signal as measured in the transistor television circuit shown in FIG. 8.

In order to know the operating characteristics of the invention, a piezoelectric ceramic material, in a disk form, having a composition of 99 wt. percent $$Pb(Mg_{1/3}, Nb_{2/3})_{0.4375}Ti_{0.4375}Zr_{0.125}O_3+1$$

weight percent $MnO_2$ was used for a piezoelectric ceramic resonator element as shown in FIG. 1. The piezoelectric ceramic material had an electromechanical radial coupling coefficient of 38% and a frequency constant of 2490 kc.-mm. in its radial direction. FIG. 2 shows frequency spectra of the natural vibration of the piezoelectric ceramic resonator elements of various ratio of diameter D to thickness T, under applying an alternating electric field across the electrodes 3 and 3′.

In FIG. 2, the product of the frequency $f$ (kc./sec.) of natural vibration and the thickness T (mm.) of the disk resonator element $f \times T$, is plotted as a function of $D/T$. The calculation values made by R. D. Mindlin are shown by solid lines in FIG. 2. The flexural vibrations are expressed by lines in a high slope and the thickness-shear vibrations, by lines in a low slope. The dots marked by "⊙" in FIG. 2 represents a group of thickness-shear vibrations and the dots marked by "·" represent a group of flexural plotted on vibrations. Subresonant vibrations are liable to appear in a region of the transition from the flexural vibrations to the thickness-shear vibrations along with the solid lines. Many irregular subresonant vibrations not being the solid lines are observed in the region of the transitions from the flexural vibration to the thickness-shear vibrations.

Figure 3:
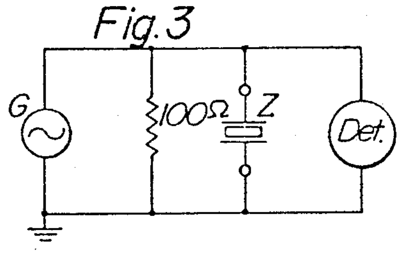
FIG. 3 is a schematic diagram of a circuit being used for measurng the impedance of the piezoelectric ceramic resonator element Z of FIG. 1.

FIG. 3 shows a circuit arrangement used for the measurement of the impedance levels of element of this invention. In FIG. 3, G designates a variable frequency generator; "Det.", a voltmeter; and Z, the impedance element to be measured.

Figure 4:
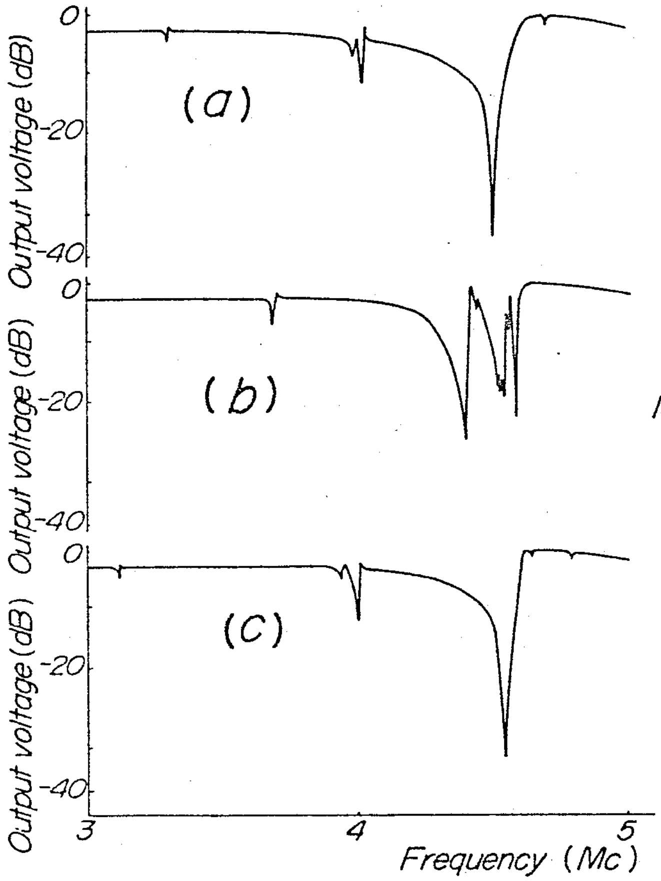
FIG. 4 is a graphic illustration of the impedance level of the piezoelectric ceramic resonator element of FIG. 1.
Figure 5:
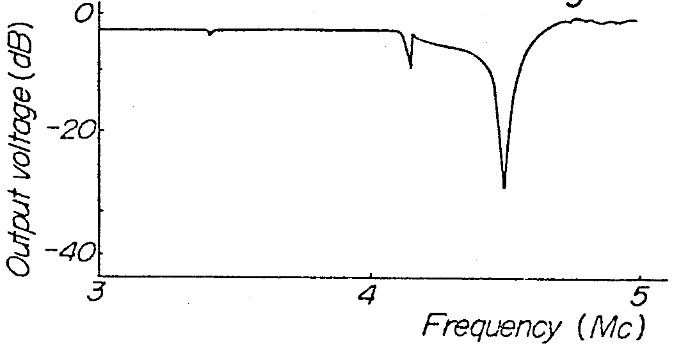
FIG. 5 is also a graphic illustration of the impedance level of the piezoelectric ceramic resonator element of FIG. 1. The element is a different piezoelectric ceramic material from FIG. 4.

FIGS. 4 and 5 show the measurement of impedance level structure obtained by the circuit of FIG. 3. FIG. 4 *a*, *b* and *c* represent the impedance levels of piezoelectric ceramic resonator elements of 0.254 mm. in thickness, and 11.0, 10.0 and 9.3 of $D/T$, respectively. A comparison of FIG. 2 and FIG. 4, indicates that many subresonant vibrations take place in the region of the transition from flexural vibraton to thickness-shear vibration, for example, at the diameter-thickness ratio $D/T=10.0$, and result in similar resonant impedance levels as shown in FIG. 4*b*. In contrast to the above, the subresonant vibrations do not occur in the regions of the thickness-shear vibration such as $D/T=11.0$ and $D/T=9.3$. The thickness-shear vibration in the region is solely intensified and results in the single resonant characteristics. At the same time the resonant impedance level of the thickness-shear vibration can be decreased by 20 db or more.

Any variation in the physical constants such as Poisson's ratio, Young's modulus, shear modulus etc. results in a variation in the value of curves shown by the solid lines in FIG. 2. The desired characteristics in "*a*" or "*c*" of FIG. 4, however, can be obtained for suitable ratio $D/T$ in a region of the thickness-shear vibration.

For example, the thicknes-shear vibration can be obtained at $D/T \doteqdot 10.2$ and $D/T \doteqdot 12.6$ with a pure barium titanate piezoelectric ceramic material of 0.3 mm. in thickness. FIG. 5 shows the characteristics of piezoelectric ceramic disk, in pure barium titanate, of $D/T=10.2$.

The minimum output shown in FIG. 4*a*, 4*c* or 5 is quite small or of an order of 0.5 to 2 ohms. The low resonant impedance of 0.5 to 2 ohms cannot be obtained with quartz crystal resonator elements or any other vibration modes of the piezoelectric ceramic resonator element at the same frequency.

A piezoelectric ceramic material of 0.1 to 1 mm. in thickness must be provided with the $D/T$ ranging from 7 to 15 and existing in the region of the thickness-shear vibration to make the resonant impedance of the fundamental thickness-shear vibration lower by 20 db than other resonant impedances. At the $D/T$ value of less than 7, the flexural vibration is intensified and then it is difficult to obtain a difference of more than 20 db between the resonant impedance of the thickness-shear vibration and other resonant impedances. On the other hand, at the $D/T$ value of more than 15, inharmonic overtones of the thickness-shear vibration are intensified near fundamental thickness-shear vibration. The intensified coupling caused by the intensified inharmonic overtones makes it difficult to eliminate the subresonant vibrations. Therefore, it is difficult to obtain a difference of more than 20 db between the resonant impedance of the thickness-shear vibration and other subresonant impedances.

Generally a number of subresonant vibrations existing near the resonant frequency of the fundamental thickness-shear vibration increases with an increase in the electromechanical coupling coefficient. According to the present invention, a piezoelectric ceramic resonator element with satisfactory characteristics, however, can be obtained by a piezoelectric ceramic material which has a mechanical qualify factor Q of at least more than 300.

A uniformly and unidirectionally polarized piezoelectric ceramic material is prepared and a plate is cut therefrom by a diamond cutter in a manner that the major surfaces are in parallel with the direction of polarization. To obtain a precise parallelism of the major surfaces, the cut surfaces may preferably be polished. The cut specimen is then treated with the electrodeless copper plating in order that copper is deposited all over the major surfaces. Then the specimen having the copper electrodes thereon is immersed in an aqueous solution of metal ions such as gold ions or silver ions which is nobler than copper ions. For example, the surface layers of the copper electrode is displaced by silver using an aqueous solution of silver salt. After this step, the specimen is shaped into a circular disk of the diameter D as shown in FIG. 1 using an ultrasonic machining apparatus. There is utterly no fear of disappearance of polarization during the above processes because the specimen is always maintained at temperatures from room temperature to 60° C.

The electrodes provided in the above manner are easily corroded by a nitric acid solution. Therefore the electrodes may also be provided in the following manner. A disk having the diameter D and the thickness T is cut and machined from a pre-polarized piezoelectric ceramic material in the manner as described and then electrodes are deposited all over the disk surfaces. A suitable resin being not attacked by nitric acid is coated on the surfaces required to act as electrodes and the specimen is immersed into a nitric acid solution to remove unnecessary electrode portions at room temperature without a change in the dimension of the specimen. The method for providing electrodes as described above is extremely advantageous in the precise control of the electrode thickness less than 1 micron. The electrodes are composed from fine plating particles and stable in a common atmosphere in addition to their remarkably good solderbility. Copper particles deposited by the electrodeless plating method have a diameter of less than 1 micron, while pin holes having a diameter of more than several microns generally exist on the polished surfaces of the piezoelectric ceramic material. Therefore, the polished surfaces of the specimen of a piezoelectric ceramic material having such pin holes thereon should be compactly covered by the copper particles by the electrodeless copper plating method. Accordingly, detrimental irregular subresonant vibrations are effectively suppressed. Unless the copper electrodes compactly cover the pin holes existing on the surfaces of the piezoelectric ceramic material, irregular subresonant vibrations can not be eliminated.

Figure 6:
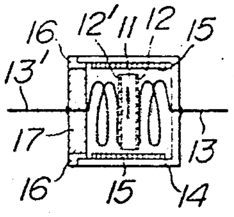
FIG. 6 is a sectional view of an embodiment of the piezoelectric ceramic resonator device according to the present invention.

The resonant spectrum of the disk resonator element obtained in this manner, indicate that a variation in the diameter-thickness ratio $D/T$ results in a variation in its natural vibration spectrum as shown in FIG. 2 and hence in a remarkable variation in the resonant impedance of each natural vibration. A precise adjustment for the desired characteristics, however, can easily be achieved by polishing the peripheral face of the disk element under rotating the disk element about its axis Hereunder, a structure supporting the above-described resonator element and a method for providing electrical connection as a ceramic resonator device of the present invention will be described with reference to FIGS. 6 and 7. FIG. 6 shows a sectional view of an embodiment of such piezoelectric ceramic resonator device. In FIG. 6, the above-described disk resonator element of thickness-shear vibration mode and electrodes thereon are designated by reference numerals 1 and 2, 2', respectively. An electrically conductive elastic lead wire 3 is partly fixed to a capsule 4, and a similar lead wire 3' is partly fixed to an end closure or base 7 of the capsule 4. As shown in FIG. 6, the lead wires 3 and 3' are suitably coiled in the capsule 4 to press together the peripheral edge portions of the electrodes 2 and 2' of the disk resonator element 1 in its axial direction. A cylinder 5 composed of electrical insulator and a vibration absorbing material is fitted within the case 4 to prevent the capsule 4 from contacting the resonator element 1. The end closure 7 is made of an electrical insulator and an annular member 6 is interposed between the end edge of the capsule 4 and the end closure 7 to plug the annular space therebetween. As will be apparent from FIG. 6, electrical connection of the electrodes of the resonator element to the outside is achieved by an elastic pressure contact of the coiled ends of the lead wires 3 and 3' with the respective electrodes 2 and 2' of the resonator element 1. At the same time, a pressure contact between the elastic lead wires and the resonator element is limited to the peripherl edge portions of the electrodes 2 and 2'. As a result, the central portion of the thickness-shear resonator element having the highest vibration energy is left free from the resonant driving condition. The vibration efficiency of the resonator element will be understood not being decreased at all by virtue of this manner of enclosure of the resonator element in the casing.

Figure 7:
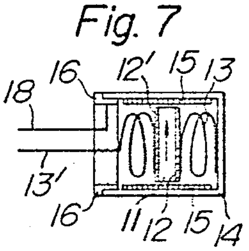
FIG. 7 is also a sectional view of another embodiment of the piezoelectric ceramic resonator device according to the present invention.

FIG. 7 shows another embodiment of the present invention. The resonator device can more conveniently be used in practical application and the device is suitable for automatic assembly. Numerals appearing in FIG. 6 are used to designate similar parts to those in FIG. 7. Electrically conductive elastic lead wires 3 and 3' coiled in a coil spring form are likewise used to apply elastic pressure to the disk resonator element 1 to support the resonator element in its axial direction and provide electrical connection to the outside. In FIG. 7, the spring 3 is not fixed to a metal capsule 4 but merely pressed an electrode 2 on the resonator element 1 against the inside wall of the capsule 4. In this case the metal capsule 4 per se acts as a method for providing electrical connection between the electrode 2 and the outside. Thus, an optional portion of the metal capsule 4 may be used as an electrical terminal, if required.

An example of a circuit including therein the ceramic resonator device of the present invention will next be described. FIG. 8 shows a part of a sound trap circuit of a transistor television. A sound intermediate frequency signal SIF and a detected video signal VID applied to a base of a transistor $TR_1$ are separated from each other at the collector and emitter of the transistor $TR_1$. The SIF signal derives from the collector and the VID signal derives from the emitter of transistor $TR_1$. Then the SIF signal is transmitted through an intermediate frequency transformer to a SIF amplifier while the VID signal is amplified by a transistor $TR_2$.

In the circuit of FIG. 8, reference character "S" described between terminals 1 and 2 represents the piezoelectric ceramic resonator device of the present invention having the fundamental thickness-shear vibration at the sound intermediate frequency.

FIG. 9 shows an electrical equivalent circuit of the thickness-shear disk resonator element. In FIG. 9, $C_{11}$ represents an electrostatic capacity between the electrodes. $L_T$, $C_T$ and $R_T$ represent an equivalent mass, equivalent stiffness and equivalent loss, respectively, of the thickness-shear vibration, while $L_1, L_2, L_3, \ldots C_1, C_2, C_3, \ldots$ and $R_1, R_2, R_3 \ldots$ represent equivalent masses, equivalent stiffness, and equivalent losses, respectively, of the flexural or coupling vibrations. In the circuit of FIG. 8, impedance as looked towards either side of the terminals 1 and 2 is ordinarily of an order of several ten ohms to several hundred ohms. The resonant impedance $R_T$ of the fundamental thickness-shear vibration lower than 1 ohm is easily obtained at the frequency of the sound intermediate frequency signal. Further by adjusting the diameter of the resonator element in the manner as described previously, it is possible to make resonant impedances of existing unwanted vibrations or an electrostatic capacitance impedance of the electrodes have a value more than several ten ohms at frequencies below the sound intermediate frequency. Therefore, by inserting the piezoelectric ceramic resonator device S between the terminals 1 and 2 in FIG. 8, the emitter of $TR_1$ is grounded for the sound intermediate frequency so that $TR_1$ acts as a grounded emitter amplifier to amplify the SIF signal at the collector of $TR_1$. For frequencies below the sound intermediate frequency, $TR_1$ acts as an emitter follower amplifier so that the VID signal can be derived from the emitter of $TR_1$.

As an example, a piezoelectric material having a composition of 99 wt. percent $$Pb(Mg_{1/3}, Nb_{2/3})_{0.4375}Ti_{0.4375}Zr_{0.125}O_3+1$$

weight percent $MnO_2$ was employed to make a thickness-shear disk resonator element having a diameter of 2.8 mm. and a thickness of 0.253 mm. This resonator element was inserted in a circuit as shown in FIG. 8 to find out the operating characteristics with respect to a sound intermediate frequency at 4.5 mc. The resonator element showed excellent sound trapping characteristics as shown in FIG. 10.

The present invention will be understood from the foregoing description to offer many advantages over piezoelectric elements of prior types. One of the advantages is that a sound trap circuit element in a transistor television can be composed of a single solid disk in an extremely simple structure and thus results in smaller size and less expense than that of an ordinary composite part of an electromagnetic coil and a capacitor. A further advantage is that the mechanical vibration system of the present invention, can obtain a higher value of Q than a prior resonant circuit of an electromagnetic coil and a capacitor do, and that no frequency adjustment is required because frequency stability at resonance is higher than the conventional coil and capacitor. Another advantage is that resonant impedance of the thickness-shear resonator element can be made smaller than resonant impedances of thickness-expansion and contour vibrations in a same resonant frequency.

The above description is merely intended to illustrate various facts in certain selective embodiments of this invention, and it will be apparent that various changes and modifications may be made without departing from the spirit and scope of the invention as defined in the appended claims.

What is claimed is:

1. A piezoelectric ceramic resonator element comprising a thin flat circular disk of polarized ferroelectric ceramic material, said disk having substantially parallel major surfaces, said major surfaces having thereon electrodes of copper and silver disposed in superposed relation one on the other, said copper electrodes being formed by the electrodeless copper plating method and at least covering the entire major surfaces including pin holes existing on said surfaces and said silver electrodes being deposited by the chemical displacement of a silver salt solution on the surfaces of said copper electrodes, said disk being polarized unidirectionally in parallel to said major surfaces and being adapted to make a piezoelectric response to electrical potential gradients across said electrodes in a manner that the thickness-shear vibration mode is predominant while the flexural vibration mode and the subresonant vibration modes are negligible, and said disk having a thickness dimension so determined that resonance of vibration in said thickness-shear vibration mode takes place at a particularly selected frequency and having a diameter dimension so determined that the resonant impedances of the flexural vibrations and subresonant vibrations are at least ten times larger than the resonant impedance of the fundamental thickness-shear vibration in a range of the diameter-thickness ratio of from 7 to 15.

2. A piezoelectric ceramic resonator element according to claim 1, in which a gold salt solution is used instead of said silver salt solution to displace the surfaces of said copper electrodes by gold.

3. A piezoelectric ceramic resonator device comprising a thin flat circular disk of polarized ferroelectric ceramic material, said disk having substantially parallel major surfaces, said major surfaces having thereon electrodes of copper and silver disposed in superposed relation one on the other, said copper electrodes being formed by the electrodeless copper plating method and at least covering the entire major surfaces including pin holes existing on said surfaces and said silver electrodes being deposited by the chemical displacement of a silver salt solution on the surfaces of said copper electrodes, said disk being polarized unidirectionally in parallel to said major surfaces and being adapted to make a piezoelectric response to electrical potential gradients across said electrodes in a manner that the thickness-shear vibration mode is predominant while the flexural vibration mode and the subresonant vibration modes are negligible, and said disk having a thickness dimension so determined that resonance of vibration in said thickness-shear vibration mode takes place at a particularly selected frequency and having a diameter dimension so determined that the resonant impedances of the flexual vibrations and subresonant vibrations are at least ten times larger than the resonant impedance of the fundamental thickness-shear vibration in a range of the diameter-thickness ratio of from 7 to 15, a capsule for enclosing therein said disk of ferroelectric ceramic material, and a pair of wire leads of resilient and electrically conductive material partly fixed to said capsle and electrically insulated therefrom, said leads having coiled ends pressed against peripheral edge portions of the opposite electrodes on said disk so as to axially resiliently support said disk in said capsule.

4. A piezoelectric ceramic resonator device according to claim 3, in which a gold salt solution is used instead of said silver salt solution to substitute the surfaces of said copper electrodes by gold.

5. A piezoelectric ceramic resonator device comprising a thin flat circular disk of polarized ferroelectric ceramic material, said disk having substantially parallel major surfaces, said major surfaces having thereon electrodes of copper and silver disposed in superposed relation one on the other, said copper electrodes being formed by the electrodeless copper plating method and at least covering the entire major surfaces including pin holes existing on said surfaces and said silver electrodes being deposited by the chemical displacement reaction of a silver salt solution on the surfaces of said copper electrodes, said disk being polarized unidirectionally in parallel to said major surfaces and being adapted to make a piezoelectric response to electrical potential gradients across said electrodes in a manner that the thickness-shear vibration mode is predominant while the flexural vibration mode and the subresonant vibration modes are negligible, and said disk having a thickness dimension so determined that resonance of vibration in said thickness-shear vibration mode takes place at a particularly selected frequency and having a diameter dimension so determined that the resonant impedances of the flexural vibrations and subresonant vibrations are at least ten times larger than the reasonant impedance of the fundamental thickness-shear vibration in a range of the diameter-thickness ratio of from 7 to 15, a metal capsule for enclosing therein said disk of ferroelectric ceramic material, and first and second wire leads of resilient and electrically conductive material suitably coiled so as to be pressed at one end against peripheral edge portions of the opposite electrodes on said disk for axially resiliently supporting said disk in said capsule, said first wire lead having the other end resiliently pressed against said metal capsule, said second wire lead being partly fixed to said metal capsule while being electrically insulated therefrom and drawn outwardly of said capsule, whereby said second wire lead and a portion of said metal capsule can be used as electrical terminals.

6. A piezoelectric ceramic resonator device according to claim 5, in which a gold salt solution is used instead of said silver salt solution to substitute the surfaces of said copper electrodes by gold.

References Cited

UNITED STATES PATENTS

| | | | |
|---|---|---|---|
| 2,306,909 | 12/1942 | Sykes | 310—9.5 |
| 2,343,059 | 2/1944 | Hight | 310—9.5 |
| 2,485,129 | 10/1949 | Baerwald | 310—9.5 |
| 2,488,781 | 11/1949 | Reeves | 310—9.2 |
| 2,515,673 | 7/1950 | Sylvester | 310—9.2 |

OTHER REFERENCES

IRE Publication, entitled Quartz AT Type Filter Crystals for Frequency Range, 0.7 to 60 mc., February 1961, pp. 523–524.

MILTON O. HIRSHFIELD, *Primary Examiner.*

J. D. MILLER, *Examiner.*